United States Patent [19]

Tsen et al.

[11] 4,101,693
[45] Jul. 18, 1978

[54] METHOD OF PREPARING EPOXY-GLASS PREPREGS

[75] Inventors: Lo Kwang Tsen, Coshocton; John Louis Palkiewicz, Nashport, both of Ohio

[73] Assignee: General Electric Company, Schenectady, N.Y.

[21] Appl. No.: 525,419

[22] Filed: Nov. 20, 1974

Related U.S. Application Data

[62] Division of Ser. No. 169,463, Aug. 5, 1971, abandoned.

[51] Int. Cl.² .................. B05D 3/02; B32B 17/10
[52] U.S. Cl. ............................ 427/386; 427/390 A; 428/273
[58] Field of Search .................. 427/386, 390 A; 428/273; 260/830 TW

[56] References Cited

U.S. PATENT DOCUMENTS

| 3,177,090 | 4/1965 | Bayes | 260/830 R |
| 3,321,549 | 5/1967 | Barth | 260/830 TW |
| 3,424,707 | 1/1969 | Schaufelberger | 260/830 TW |
| 3,454,421 | 7/1969 | Westbrook | 428/273 X |
| 3,477,900 | 11/1969 | Soukup et al. | 428/273 X |

*Primary Examiner*—Harry J. Gwinnell

[57] ABSTRACT

Epoxy resin compositions comprising a first epoxy resin having a relatively low epoxy equivalent weight of about 170 to 200 and an average functionality of 2 or less, a second epoxy resin having a relatively high epoxy equivalent weight of about 900 to 1900 and an average functionality of 2 or less, and a curing system. Glass fabric is impregnated with the epoxy resin composition and formed into laminates, which are especially useful in the manufacture of printed circuit boards.

7 Claims, No Drawings

METHOD OF PREPARING EPOXY-GLASS PREPREGS

This is a division of application Ser. No. 169,463 filed Aug. 5, 1971, now abandoned.

This invention relates to epoxy resin compositions. In its more specific aspect, this invention relates to epoxy resin compositions especially useful in glass-base laminates exhibiting improved properties.

Glass-base laminates prepared from glass fabric impregnated with an epoxy resin are used in the manufacture of printed circuit boards. The laminate should exhibit, as a general rule, good mechanical, electrical and chemical properties as well as flame retardancy. Nonetheless, these laminates must keep apace with advances in technologies utilizing them which, in turn, lends to more stringent property requirements.

Epoxy glass laminates, having a copper clad on one or both faces, are subject to severe cleaning and etching processes. The laminate, therefore, must possess superior chemical and solvent resistance. Equally important is the peel strength which is the measure of bond strength between the metal foil and laminate. This bond should be sufficiently strong not only as measured at room temperature and for hot peel at 125° C., but also after the solder float test with solder at 500° F. and after continuous service at high temperatures of about 100° C.

In the manufacture of printed circuit boards, the laminate is subjected to molten solder by solder floating or solder waving in order to connect the electrical components to the board. If the laminate is defective, it may show numerous cracks on the surface, and in extreme cases blisters may form. This defect is known as "measling," which generally is caused by relatively low heat-resistance or high moisture absorption of the laminates. These adverse properties are affected by the quality of the laminating epoxy resins and, to some extent, by the manufacturing processes.

When electrical components are to be connected to the printed circuit board, a plurality of holes are drilled in the laminate, which may be plated or soldered to provide electrical connections. Holes drilled with high speed carbide tipped drills must be smooth and clean and have good dimensional tolerance so that electronic components can be inserted into the holes and firmly soldered in place. If the epoxy resin composition sets to a very high cross-linked density, forming a tight and dense cross-linked lattice, the resin may cause rapid wearing of the drills. On the other hand, improperly balanced epoxy resin compositions that have a low heat distortion temperature would give a "soft" laminate, and the heat generated during drilling softens the drill dust which smears the holes or sticks to the drill. In severe cases, the excessive heat generated by drilling might degrade the surrounding resin to show a defect known as "halo" and separation of the metal foil from the laminate around the holes might occur.

Efforts have been made to overcome the aforementioned problems or defects by modifying the epoxy resin formulation or curing system, or by varying the manufacturing operations. While some properties have been improved to the expected levels, it is often discovered that such improvements are at the expense of other properties. For example, epoxy resin having a high functionality, such as an epoxy novolac or tetrakis (hydroxyphenyl) ethane tetraglycidal ether, may be blended into the diglycidyl ether of bisphenol-A type epoxy resin to improve the elevated temperature performance and high distortion temperature and to reduce the drill smear of the laminate, but the resin results in laminates exhibiting high rigidity, higher drill wear, and possibly low metal peel strength and discoloration. Post curing of laminates made from conventional epoxy resin often improves their properties; it also may cause warpage and surface non-uniformity. Similarly, modifying the curing system may adversely affect metal foil adhesion, color of the laminates, electrical properties, mechanical properties and hardness.

This invention has therefore as its object to provide improved epoxy resin compositions suitable for impregnating glass fabrics for use in the manufacture of laminates, including metal clad laminates, which exhibit superior electrical, physical and chemical properties.

According to this invention, there is provided an epoxy resin composition comprising a blend of epoxy resins having substantially different epoxy equivalent weights and each having an average functionality of 2 or less, but in no event is the functionality for a resin molecule greater than 2, and a curing sytem. The first epoxy resin has a relatively short molecular chain length indicated by an epoxy equivalent weight of about 170 to 200, and is sometimes referred to herein as the blending resin. The second epoxy resin, sometimes referred to herein as the epoxy base resin, has a relatively long molecular chain length indicated by an epoxy equivalent weight of about 900 to 1900, and may be non-halogenated or halogenated (e.g., brominated). The epoxy resins are described herein below in greater detail.

In preparing the resin composition, the base resin and blending resin are admixed at room temperature in the ratios of about 70 to 40% by weight of the base resin to 30 to 60% by weight of the blending resin, and preferably 65 to 50% to 35 to 50%. Sufficient or adequate antimeasling is not attained if the resin compositions contain less than about 30% by weight of the blending resin. On the other hand, if more than 60% of the blending resin is used, the finished laminate is too hard for general application and further may interfere with drilling.

It is well known that epoxy resins may be prepared as the reaction product of a halohydrin and a phenol. A widely used class of epoxy resins is typified by the reaction between epichlorohydrin and bis-(4-hydroxyphenyl-2,2 propane, the latter being commonly referred to as bisphenol A, and may be represented by the general formula:

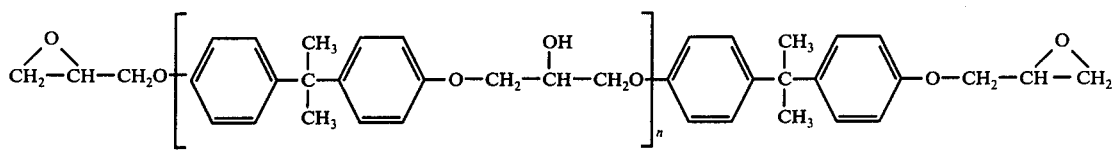

where n may have an average numerical value between 0 to about 7, depending for the most part on the relative proportions of two reactants. Although the invention is described in detail with references to epichlorohydrin and bisphenol A, it should be understood that other halohydrins and polyhydric phenols may also be used. Such epoxy resins are sold under the tradenames of Epon by Shell Chemical Corporation, Araldite by Ciba Company, Epi-Rez by Celanese Corporation, ERL by Bakalite Company, and D.E.R. by Dow Chemical Company.

The epoxy blending resin is prepared by reacting epichlorohydrin and bisphenol A in the presence of sodium hydroxide as a scavengering catalyst, or other suitable alkali metal catalyst. The proportion of reactants may range from about 2 to 10 moles of epichlorohydrin per mole of bisphenol A. The resulting epoxy resin is characterized by an epoxy equivalent weight of 170 to 200, wherein the value of n in the above general formula is between 0 to 3, and an average functionality of 2 or less, usually 1.7 to 2, but in no event is the functionality for a resin molecule greater than 2. Such resins are available on the market, for example, as Epon 828, Epon 826, Epon 825, D.E.R. 332, D.E.R. 331, Epi-Rez 510 and Epi-Rez 5108.

The epoxy base resin is prepared by reacting (1) the diglycidyl ether of bisphenol A with (2) a calculated amount of bisphenol A or other suitable polyhydric phenol such as dihydroxy diphenyl, bisphenol A, hydroquinone and resorcinol. Where desired, a halogenated bisphenol such as tetrabromobisphenol A may be substituted for the bisphenol A. The epoxy equivalent weight of the resulting resin depends largely upon the proportions of reactants, which may range from about 20 to 50% by weight of bisphenol A. The resulting epoxy resin base desirably has an epoxy equivalent weight of 900 to 1900 and an average functionality of not more than 2. Generally the epoxy equivalent weight for the base resin is lower when bisphenol A is used than when tetrabromobisphenol A is used.

In the preferred embodiment, the epoxy base resin is prepared by the fusion process described in U.S. Pat. No. 3,477,990, because of its simplicity and control of molecular weight. In the fusion process, epoxy resin of digycidyl ether of bisphenol A is combined with a calculated amount of bisphenol A or tetrabromobisphenol A and an organo-phosphonium halide, such as methyl triphenyl phosphonium iodide, and reacted at 150° to 200° C. The epoxy resin containing the phosphonium halide catalyst is sold under the tradename Epon 829 in solution form containing about 3.5% by weight of xylene-oxital solvent mixture. Other precatalyzed epoxy resins which are also useful and sold as a liquid include D.E.R.7030.6 and ARALDITE 9410. Where desired, other dihydric phenols or biphenols can be substituted for the bisphenol A or tetrabromobisphenol A as described in the aforesaid patent. The epoxy base resins prepared by the fusion process have an epoxy equivalent weight ranging from as low as 500 to as high as 7000 depending on the calculated quantity of bisphenol used. For purposes of this invention, the epoxy equivalent weight for the epoxy base resin should range from about 900 to 1,400 when bisphenol A is used and from about 1200 to 1900 when tetrabromobisphenol A is used.

The curing system for the epoxy compositions of this invention includes a cross-linking agent and a promoter, which preferably are dissolved in a suitable solvent and then admixed with the epoxy resins. Dicyandiamide is especially useful as the cross-linking agent for epoxy resin compositions which are anti-measling. In the preferred embodiment, about 2.5 to 5 parts by weight based on the total weight of the resin composition of dicyandiamide dissolved in dimethyl formamide is used as the cross-linking agent, but other suitable curing systems include diamino-diphenyl-sulfone as the cross-linking agent together with boron trifluoride mono-ethylamine complex as the promotor, meta-phenolene diamine as the cross-linking agent, and organic anhydride cross-linking agents such as hexahydrophthalic anhydride or chorendic anhydride which may be used with or without a promoter. When dicyandiamide is used, it is preferable to use a tertiary amine as the promoter, usually in an amount of about 0.3 to 0.8 parts by weight per 100 parts of resin solids. These tertiary amines may include, for example, benzyldimethylamine, 2,4,6-tris(di-methylamino methyl) phenol, hydroquinone-blocked triethylene-di-amine, 1-methyl imidazole and other imidazoles.

The resin mixture and curing system may be diluted with a suitable solvent or diluent to render the resin composition especially useful as an impregnating composition. Preferably, the final resin composition has 40 to 60% resin solids, a viscosity of 15 to 50 centipoises and a specific gravity of 0.990 to 1.150. Suitable solvents include, for example, ethylene gylcol monomethyl ether (methyl cellosolve), acetone and other ketones such as methylethyl ketone.

The invention is further illustrated by the following examples, in which the quantities are stated in parts by weight unless otherwise indicated.

EXAMPLE I 60 parts of an epoxy base resin having an epoxy equivalent weight of 950 prepared by the fusion process described above from Epon 829 and bisphenol A was dissolved in 6 parts of methyl Cellosolve and 36 parts of acetone and then blended with 40 parts of Epon 828 as the epoxy blending resin. The resulting resin blend had a solids content of 70% and a specific gravity of 1.060 and a viscosity of 450 centipoises. Three parts of dicyandiamide was dissolved in 15 parts of dimethyl formamide and 9 parts of methyl Cellosolve. The dicyandiamide cross-linking solution was mixed with the resin blend, and 0.5 parts of benzyl dimethylamine as a promoter was added. Twenty eight parts of acetone was added to dilute the final resin composition to 53% solids content. Six hours after the addition of the promoter, the final resin composition had a specific gravity of 1.010 and a 170° C. stroke cure of 210 to 220 seconds.

The pot life of the final resin composition was about 3 days at 20° C. or below. Its storage life without the benzyl dimethylamine promoter was more than 3 months.

A woven glass fabric of 7 mils thickness prefinished with silane varnish was dipped in the epoxy resin composition to form a prepreg (a partially cured epoxy resin impregnated glass fabric). Impregnation of the fabric was adjusted in such a way that when the wet impregnated sheet was dried at 155° C. in an oven to advance the resin, 10 to 16% by weight of the resin, based on the combined weight of the resin composition and fabric, was pressed out of the prepreg in a hydraulic press at 170° C. and under a pressure of 1000 psi but that before squeeze out the weight increase of the fabric due to the resin pick-up was 66 to 73%.

A plurality of sheets were cut from the prepreg and stacked with one ounce copper foil. The layup was pressed at an elevated temperature and pressure by conventional practice to form a laminate.

Conventional tests for laminates of this type were conducted, and the tests results are set forth in the following table:

TABLE I

TESTS FOR LAMINATES

|  | Condition | Characteristics | NEMA Requirements | Methods |
|---|---|---|---|---|
| Thickness |  | 0.062" |  |  |
| Water Absorption | D24/23 | 0.072% | 0.35 max. | NEMA LI—1-10.12 |
| Flexural Strength | L | 82 000 | 60 000 min. | ASTM D790 |
|  | C | 62 000 | 50 000 min. | ASTM D790 |
| Dissipation Factor | D24/23 | 0.023 | 0.035 max. | ASTM D150 |
| Dielectric Constant | D24/23 | 4.43 | 5.40 max. | ASTM D150 |
| Surface Resistance | C96/35/90 | 50,000 | 1,000 min. | ASTM D257 |
| Volume Resistance | C96/35/90 | $11.6 \times 10^6$ | $1 \times 10^6$ min. | ASTM D257 |
| Peel Strength (2 oz.) | A | 13.5 | 11.0 min. | NEMA LI—1-10.12 |
| (Elevated) | 60' at 125° C | 13.2 | — | NEMA LI—1-10.12 |
| Solder Flost Blistering | 500° F | >180 sec. | 20 sec. min. | NEMA LI—1-10.11 |

In addition, a 15 psig. steam pressure cooking test was conducted for the purpose of determining the antimeasling property of the laminates. According to this test, samples measuring 2 × 3 inches were placed in an autoclave just above the water line. The water was heated to 250° F. at a constant steam gauge pressure of 15 psi. The samples were held under such steam pressure; and every ½ hour a piece was taken out to check solder float blistering for 60 seconds. The sample withstood a cooking time of usually more than three hours without showing any measling defect after 60 seconds of solder floating. The specification for this test requires that tests specimens show no measling or blistering after two hours of steam pressure cooking. General purpose epoxy resins used in glass laminates typically show measling or blistering after only one-half hour of pressure cooking time.

EXAMPLE II

Substantially the same resin composition as described in Example I was used in preparing laminates except that 75 grams of the base resin was admixed with 25 grams of the blending resin. Laminates prepared from this composition showed measling after 60 seconds solder floating when the laminates had been subjected to pressure cooking test for two hours. According to the test specification there should be no measling after two hours of pressure cooking. Failure clearly illustrated the importance of the ratio of resins in attaining anti-measling.

EXAMPLE III

Sixty three parts of brominated epoxy resin base having an epoxy equivalent weight of 1400 and a bromine content of 26% by weight prepared by the fusion process described above from Epon 829 and a mixture of tetrabromobisphenol-A and bisphenol A, was dissolved in 7 parts of methyl Cellosolve and 37 parts of Epon 828. The resulting resin blend had a bromine content of 16.4% by weight, a specific gravity of 1.148 and a viscosity of 350 centipoises based on a solids content of 70%. The curing system of Example I was admixed with the resin blend, and glass laminates were made by the conventional process.

Test results on the laminates is shown in the following table:

TABLE II

LAMINATE TESTS RESULTS

|  | Condition | Characteristics | NEMA Requirements | Method |
|---|---|---|---|---|
| Thickness |  | 0.062" |  |  |
| Water Absorption | D24/23 | 0.073% | 0.35 max. | NEMA LI—1-10.12 |
| Solvent Resistance: |  |  |  |  |
| Trichloroethylene Absorp. | 7 min. at 190° F. | 1.5% |  |  |
| Trichloroethylene Surface |  | OK |  |  |
| 50% Methylene Chloride Absorp. | 30 min. at 75° F. | 1.5% |  |  |
| 50% Methylene Chloride Surface |  | OK |  |  |
| Flexural Strength | L | 86,500 | 60,000 min. | ASTM D790 |
|  | C | 63,500 | 50,000 min. | ASTM D790 |
| Dielectric Constant | D24/23 | 4.49 | 5.4 max. | ASTM D150 |
| Dissipation Factor | D24/23 | 0.022 | 0.035 max. | ASTM D150 |
| Dielectric Breakdown | D48/50 | S/T 76 | 30 Kv min. | ASTM D229 |
|  |  | S/S 68 | 30 Kv min. | ASTM D229 |
| Surface Resistivity | C96/35/90 | 72,000 | 1,000 min. | ASTM D257 |
| Volume Resistivity | C96/35/90 | $10 \times 10^6$ | $1 \times 10^6$ min. | ASTM D257 |
| Peel Strength (2 oz.) | A | 13.0 | 11.0 min. | NEMA LI—1-10.12 |
|  | 20 sec. at 500° F | 12.8 | 11.0 min. |  |
| Peel at elevated temperature | 60 min. at 125° C | 13.0 | 11.0 min. |  |
| Seconds to blister | 500° F | 180 sec. | 20 min. |  |
| 15 psi Pressure Cooking Test | 250° F | 3.0 hrs. | — | As in Example I |
| Fire Retardancy | sec./inch | 1-0 sec/0.75" | 15 sec/1" | NEMA LI—1-10.20 |
| Drill Test (0.042" carbide drill at |  |  |  |  |

TABLE II-continued

LAMINATE TESTS RESULTS

| | Condition | Characteristics | NEMA Requirements | Method |
|---|---|---|---|---|
| 200 RPM) | | | | |
| No. of holes drilled | | 17,000 | | |
| Smearing | | None | | |
| Drill wear | | 1.43% | | |

The solvent resistance of the laminates was tested in the laboratory by the following methods:

(a) Trichloroethylene Test—The copper foil was removed by etching with ammonium presulfate from six sample pieces, which were cleaned, dried and carefully weighed and hung directly above boiling trichloroethylene in a closed tank. After two minutes duration in the vapor, the samples were taken out one at a time at one minute intervals and immediately weighed. The results are shown in Table III

TABLE III

SOLVENT ABSORPTION

| Time In Trichloroethylene Vapor | Percent Absorption |
|---|---|
| 2 min. | 1.012% |
| 3 min. | 1.036% |
| 4 min. | 1.074% |
| 5 min. | 1.131% |
| 6 min. | 1.157% |
| 7 min. | 1.142% |

The absorption of trichloroethylene was substantially below the requirement. The samples were examined at 4 hour and 24 hour periods. No surface deterioration was observed on the etched side of the laminates and the unclad sides showed only slight surface undulation.

(b) Methylene Chloride Test—The samples were prepared the same as for the trichloroethylene test. They were immersed in 50:50 methylene chloride-methyl alcohol solution at room temperature and taken out one at a time at five minute intervals, reweighed and examined. Solvent absorption is shown in Table IV.

TABLE IV

SOLVENT ABSORPTION

| Time of Immersion | Percent Absorption |
|---|---|
| 5 min. | 0.495% |
| 10 min. | 0.792% |
| 15 min. | 0.894% |
| 20 min. | 1.175% |
| 25 min. | 1.288% |
| 30 min. | 1.246% |

The solvent absorption was well below the requirement, and the unclad surface of the laminates showed even less undulation affected by the ethylene chloride, which is a stronger solvent, than by trichloroethylene.

The drill test was made with an automatic drilling machine using a new 0.042 inch diameter carbide drill at a speed of 20,000 RPM. A stack of three sample laminates with 1 oz. copper foil clad on both sides of the laminates were clamped firmly on the drilling table and three holes were drilled through the three laminates. Drilling was automatically continued, and after 5712 drillings or a total of 17136 holes, the drill showed a diameter reduction, near the tip, of 0.0006 inch or 1.43%. Both the drill points and cutting edges showed normal wear. Samples of epoxy glass laminates, clad on both sides with copper, made with general purpose epoxy resin were tested under the same condition, and the carbide drill was broken after 2105 drillings or a total of 6315 holes. The last portion of the holes were slightly irregular and evidenced some smearing.

It will be observed from the foregoing examples and tests that laminates made from prepregs impregnated with epoxy resin compositions of this invention exhibit excellent properties, especially non-measling, non-smearing upon drilling, and solvent resistance.

What we claim as new and desire to secure by Letters Patent of the United States is:

1. A method for preparing prepregs for use in the manufacture of epoxy glass circuit board substrate laminates characterized by improved antimeasling, solvent resistance and anti-smearing upon drilling, which comprises a) impregnating a glass fabric with an epoxy resin composition comprising a first epoxy resin of diglycidy ether of bisphenol A having an epoxy equivalent weight of 170 to 200 and an average functionality of not more than 2, and a second epoxy resin comprising the reaction product of diglycidyl ether bisphenol A epoxy resin and a polyhydric phenol selected from the group consisting of bisphenol A and tetrabromobisphenol A, said resulting second epoxy resin having an epoxy equivalent weight of 900 to 1900 and an average functionality of not more than 2, the proportions of said first resin ranging from about 30 to 60% by weight of resin solids and of said second resin from about 70 to 40% by weight of resin solids, a curing system, and a suitable solvent, and b) passing the epoxy impregnated glass fabric through an oven maintained at an elevated temperature to partially advance said epoxy resin and to remove said solvent.

2. A method for preparing a prepreg according to claim 1 wherein said polyhydric phenol is bisphenol A and the epoxy equivalent weight of said second epoxy resin is 900 to 1400.

3. A method for preparing a prepreg according to claim 1 wherein said polyhydric phenol is tetrabromobisphenol A and the epoxy equivalent weight of said second epoxy resin is 1200 to 1900.

4. An method according to claim 1 wherein said curing system includes about 2.5 to 5 parts by weight per 100 parts of resin solids of dicyandiamide as a cross-linking agent and a tertiary amine as a catalyst.

5. An method according to claim 1 wherein the proportions of said first resin ranges from about 35 to 50% by weight and of said second resin from about 65 to 50% by weight.

6. A method for preparing prepregs for use in the manufacture of epoxy glass circuit board substrate laminates characterized by improved anti-measling, solvent resistance and anti-measling upon drilling, which comprises a) impregnating a glass fabric with an epoxy resin composition comprising a first epoxy resin of diglycidyl ether of bisphenol A having an epoxy equivalent weight of 170 to 200 and an average functionality of not more than 2, a second epoxy resin comprising the reaction product of diglycidyl ether bisphenol A epoxy resin and bisphenol A, said resulting second epoxy resin having an epoxy equivalent weight of 900 to 1400 and an average functionality of not more than 2, the proportions of said first resin ranging from about 35 to 50% by weight of total resin solids and of said second resin from about 65 to 50% by weight of total resin solids, about 2.5 to 5 parts by weight per 100 parts of total resin solids of dicyandiamide as a cross-linking agent, a tertiary amine as a catalyst, and a suitable solvent whereby the resultant composition includes about 40 to 60% by weight of total resin solids, and b) passing the epoxy impregnated glass fabric through an oven maintained at an elevated temperature to partially advance said epoxy resin and to remove said solvent.

7. A method for preparing prepregs for use in the manufacture of epoxy glass circuit board substrate laminates characterized by improved anti-measling, solvent resistance and anti-smearing upon drilling, which comprises a) impregnating a glass fabric with an epoxy resin composition comprising a first epoxy resin of diglycidyl ether of bisphenol A having an epoxy equivalent weight of 170 to 200 and an average functionality of not more than 2, a second epoxy resin comprising the reaction product of diglycidyl ether bisphenol A epoxy resin and tetrabromobisphenol A, said resulting second epoxy resin having an epoxy equivalent weight of 1200 to 1900 and an average functionality of not more than 2, the proportions of said first resin ranging from about 35 to 50% by weight of total resin solids and of said second resin from about 65 to 50% by weight of total resin solids, about 2.5 to 5 parts by weight per 100 parts of total resin solids of dicyandiamide as a cross-linking agent, a tertiary amine as a catalyst, and a suitable solvent whereby the resultant composition includes about 40 to 60% by weight of total resin solids, and b) passing the epoxy impregnated glass fabric through an oven maintained at an elevated temperature to partially advance said epoxy resin and to remove said solvent.

* * * * *